(12) United States Patent
Bhattacherjee et al.

(10) Patent No.: US 12,148,687 B2
(45) Date of Patent: Nov. 19, 2024

(54) SPLIT SUBSTRATE INTERPOSER WITH INTEGRATED PASSIVE DEVICE

(71) Applicant: Tokyo Electron Limited, Tokyo (JP)

(72) Inventors: Arya Bhattacherjee, Livermore, CA (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/096,595

(22) Filed: Nov. 12, 2020

(65) Prior Publication Data

US 2021/0265253 A1    Aug. 26, 2021

Related U.S. Application Data

(60) Provisional application No. 62/981,278, filed on Feb. 25, 2020, provisional application No. 62/981,267, filed on Feb. 25, 2020.

(51) Int. Cl.
*H01L 21/48* (2006.01)
*H01L 23/498* (2006.01)
*H01L 23/14* (2006.01)

(52) U.S. Cl.
CPC .... *H01L 23/49833* (2013.01); *H01L 21/4853* (2013.01); *H01L 21/486* (2013.01);
(Continued)

(58) Field of Classification Search
CPC ............. H01L 23/49833; H01L 21/486; H01L 23/49827
See application file for complete search history.

(56) References Cited

U.S. PATENT DOCUMENTS 10,522,352 B2    12/2019   Delacruz et al.
2004/0184219 A1*  9/2004   Otsuka ................ H05K 1/0231
                                                      257/E23.079
(Continued)

OTHER PUBLICATIONS

International Search Report and Written Opinion issued Mar. 29, 2021 in PCT/U22020/063313, 9 pages.
(Continued)

*Primary Examiner* — Michele Fan
(74) *Attorney, Agent, or Firm* — Oblon, McClelland, Maier & Neustadt, L.L.P.

(57) ABSTRACT

A method of forming an interposer includes providing a first interposer substrate including a first bulk material having a plurality of first through silicon vias (TSVs) extending through the first bulk material. Also provided is a second interposer substrate including a second bulk material having a plurality of second TSVs extending through the second bulk material, and a wiring plane formed on the second bulk material such that the wiring plane is electrically connected to at least one of the second TSVs. The method includes connecting a passive electrical device to at least one of the first and second interposer substrates. The first interposer substrate is joined to the second interposer substrate such that the passive electrical device is provided between the first and second interposer substrates and the wiring plane is provided as an interface wiring plane between the first and second bulk materials. The interface wiring plane is electrically connected to the passive electrical device and electrically connects at least one of the first TSVs to at least one of the second TSVs.

19 Claims, 12 Drawing Sheets

(52) U.S. Cl.
CPC ...... *H01L 23/49838* (2013.01); *H01L 23/147* (2013.01); *H01L 23/49866* (2013.01)

(56) References Cited

U.S. PATENT DOCUMENTS

| | | |
|---|---|---|
| 2011/0042795 A1 | 2/2011 | Knickerbocker |
| 2012/0081870 A1 | 4/2012 | Randall et al. |
| 2016/0013151 A1 | 1/2016 | Shen et al. |
| 2016/0043068 A1* | 2/2016 | Ramachandran ... H01L 27/0255 257/532 |
| 2019/0244948 A1 | 8/2019 | Pagani |
| 2019/0385935 A1 | 12/2019 | Gao et al. |
| 2019/0385966 A1 | 12/2019 | Gao et al. |
| 2020/0006299 A1 | 1/2020 | Liu et al. |

OTHER PUBLICATIONS

Taiwanese Office Action issued May 31, 2024 in Taiwanese Patent Application No. 110105100 (with English Translation), 19 pages.

\* cited by examiner

SPLIT SUBSTRATE INTERPOSER WITH INTEGRATED PASSIVE DEVICE

CROSS REFERENCE TO RELATED APPLICATIONS

This application claims the benefit of U.S. Provisional Application No. 62/981,267 and U.S. Provisional Application No. 62/981,278 both filed on Feb. 25, 2020. The entire contents of these applications is incorporated herein by reference.

FIELD OF THE INVENTION

The disclosure relates to integrated circuits and the fabrication of microelectronic devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Integrated circuits are widely used in the electronics industry to provide electronic devices such as smart phones, computers, and the like. Integrated circuits (ICs) include many semiconductor devices, such as transistors, capacitors and the like, which are interconnected by wiring on a semiconductor substrate. There is an ever increasing demand for smaller and faster ICs that support a greater number of complex functions for electronics devices. This demand has led to the semiconductor manufacturing industry scaling down the area of ICs on the substrate, while also improving performance and power consumption efficiencies for the IC.

In the manufacture of a semiconductor ICs (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors of the IC have been created in one plane, with wiring/metallization of the IC formed above the active device plane, and have thus been characterized as two-dimensional (2D) circuits or 2D fabrication. Scaling efforts have greatly increased the number of transistors per unit area in 2D circuits, which has enabled the integration of heterogeneous functional circuits, such as logic and memory circuits, onto the same semiconductor substrate. However, 2D scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other as another means of further scaling of ICs.

SUMMARY

Techniques herein include an advanced silicon interposer which enables advanced system integration for dissimilar technologies such as active and passive device technologies, as well as digital and analog circuit technologies. The following aspects of this disclosure provide interposers that can be applied to (but not limited to) IoT and 5G System in package modules, where 3D integration is required to deliver small form factor system solutions.

According to an aspect (1) of the disclosure, a method of forming an interposer includes providing a first interposer substrate including a first bulk material having a plurality of first through silicon vias (TSVs) extending through the first bulk material. Also provided is a second interposer substrate including a second bulk material having a plurality of second TSVs extending through the second bulk material, and a wiring plane formed on the second bulk material such that the wiring plane is electrically connected to at least one of the second TSVs. The method includes connecting a passive electrical device to at least one of the first and second interposer substrates. The first interposer substrate is joined to the second interposer substrate such that the passive electrical device is provided between the first and second interposer substrates and the wiring plane is provided as an interface wiring plane between the first and second bulk materials. The interface wiring plane is electrically connected to the passive electrical device and electrically connects at least one of the first TSVs to at least one of the second TSVs.

Aspect (2) includes the method of aspect (1), further including forming a device recess between adjacent first TSVs at a side of the first bulk material to be joined with the second bulk material.

Aspect (3) includes the method of aspect (2), wherein the connecting includes connecting the passive electrical device to the first interposer substrate within the device recess prior to the joining.

Aspect (4) includes the method of aspect (2), wherein the connecting includes connecting the passive electrical device to the wiring layer of the second interposer substrate prior to the joining, and the joining includes joining the first interposer substrate to the second interposer substrate such that the passive electrical device is provided within the device recess.

Aspect (5) includes the method of aspect (1), further including providing a plurality of external contacts formed on at least one of a side of the first substrate which is opposite to a join interface between the first and second substrates and a side of the second substrate which is opposite to the join interface.

Aspect (6) includes the method of aspect (5), wherein the providing a plurality of external contacts includes providing electrical contacts configured to connect to at least one of a die, a package substrate and a printed circuit board.

Aspect (7) includes the method of aspect (1), further including providing the first silicon interposer substrate including an external wiring plane formed on the first bulk material, and a plurality of first external electrical contacts formed on the external wiring plane. This aspect further includes providing the second silicon interposer substrate including a plurality of second external electrical contacts on a side of the second bulk material that is opposite to the interface wiring plane, and a plurality of interface contacts formed on the interface wiring plane such that each of the plurality of interface contacts joins to a respective first TSV or the passive device as part of the joining.

Aspect (8) includes the method of aspect (1), wherein at least one of the first interposer substrate and the second interposer substrate is provided as a prefabricated substrate.

Aspect (9) is a method of forming an interposer including forming a first redistribution layer on a front side surface of a first interposer substrate, the first interposer substrate having a backside surface opposite the front side surface. Through-substrate vias are formed in the first interposer substrate that extend from the first redistribution layer to the backside surface of the first interposer substrate. Also included is forming multiple recesses in the backside surface of the first interposer substrate, each recess being sized to receive a corresponding passive electrical device, and forming a second redistribution layer on a front side surface of a second interposer substrate, the second interposer substrate having a backside surface opposite the front side surface. The second interposer substrate is joined to the first interposer substrate such that each of a plurality of electrical contacts on a top surface of the second redistribution layer contact either one of the first through-substrate vias or one of the passive electrical devices.

Aspect (10) includes the method of aspect (9), wherein the plurality of electrical contacts includes device contacts and TSV contacts. In this aspect, the joining includes positioning respective passive electrical devices in respective recesses of the multiple recesses prior to joining the second interposer substrate to the first interposer substrate; and joining the second interposer substrate to the first interposer substrate such that each device contact is aligned with one of the passive electrical devices and each TSV contact is aligned with one of the first through-substrate vias.

Aspect (11) includes the method of aspect (9), wherein the plurality of electrical contacts includes device contacts and TSV contacts. In this aspects, the joining includes mounting each of the passive electrical devices to the device contacts on the second redistribution layer prior to joining the second interposer substrate to the first interposer substrate; and joining the second interposer substrate to the first interposer substrate such that the device contacts are aligned with the first through-substrate vias and the passive electrical devices are aligned to fit within the multiple recesses.

Aspect (12) includes the method of aspect (11), further including, prior to forming a second redistribution layer, forming partial TSVs in a front side of the second interposer substrate, and forming the second RDL on the partial TSVs. Also included is, after the joining, thinning the second interposer substrate from the backside to expose the partial vias and complete formation of the second TSVs.

Aspect (13) includes the method of aspect (9), further including forming vias in the second substrate that extend from the backside surface of the second substrate to the front side surface of the second substrate on which the second wiring layer is formed.

Aspect (14) includes the method of aspect (13), wherein the forming vias in the second substrate includes, after the joining, reducing a thickness of the second substrate; and forming the vias in the second substrate by processing the back side of the second substrate.

Aspect (15) includes the method of aspect (13), wherein the forming vias in the second substrate includes, prior to the forming a second wiring plane, forming partial vias in the second substrate by processing the front side surface of the second substrate, wherein the partial vias do not extend to the backside surface of the second substrate. This aspect further includes, after the joining reducing a thickness of the second substrate by processing the back side of the second substrate to expose the partial vias such that the vias in the second substrate extend from the back side surface of the second substrate to the front side surface of the second substrate.

Aspect (16) includes an interposer including a first substrate including first bulk material having a first TSV extending through the first bulk material, and a second substrate including second bulk material having a second TSV extending through the second bulk material and a wiring plane formed on the second bulk material in electrical contact with the first TSV. A join interface connects the first and second substrates such that the first wiring plane of the first substrate physically contacts the second substrate and the first TSVs are electrically connected to the second TSVs through the wiring plane. A passive electrical device is integrated within the interposer at the join interface, wherein the passive electrical device is electrically connected to the wiring plane.

Aspect (17) includes the interposer of aspect (16), wherein the first bulk material and the second bulk material each include Si.

Aspect (18) includes the interposer of aspect (16), further including a plurality of first external electrical contacts provided on a side of the first substrate that is opposite to the join interface, and a plurality of second external electrical contacts provided on a side of the second substrate that is opposite to the join interface.

Aspect (19) includes the interposer of aspect (18), wherein the first and second external electrical contacts include electrical contacts configured to connect to at least one of a die, a package substrate and a printed circuit board.

Aspect (20) includes the interposer of aspect (16), further including a plurality of interface electrical contacts provided at the join interface between the first and second substrates, wherein each of the interface contacts electrically connect the first wiring plane of the first substrate to the second TSVs or the passive device.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
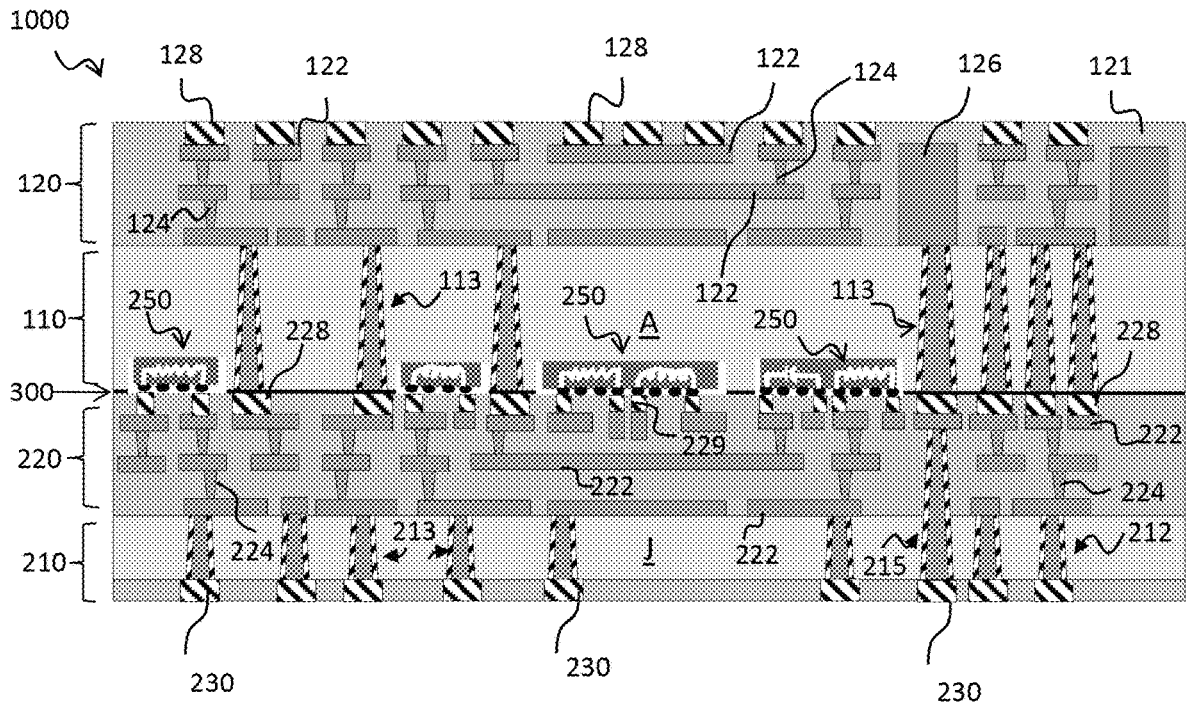
FIG. 1 is a vertical section view representing a split substrate interposer with integrated passive devices, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

As noted in the Background, semiconductor device fabricators have expressed a desire for three-dimensional (3D) semiconductor circuits in which transistors are stacked on top of each other as another means of scaling ICs. 3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e. the vertical stacking of semiconductor devices, aims to overcome 2D scaling limitations by increasing transistor density in volume rather than area. Although device stacking has been successfully demonstrated and implemented by the flash memory industry with the adoption of 3D NAND, mainstream CMOS VLSI scaling, as used for example in CPU (central processing unit) and GPU (graphics processing unit) products, is exploring adoption of 3D integration as a primary means of moving the semiconductor roadmap forward, and thus desires enabling technologies. One such technology is the use of interposers for enabling system in package (SIP) integration.

The goal for advanced system integration is to package an electronic system in a very small form factor also referred to as 3D system in package. It is desired to have a solution that includes dissimilar active and passive devices with diverse electrical, electromagnetic, thermal and mechanical properties. One significant challenge is to create an interposer architecture which minimizes area loss due to a relatively large amount of passive devices required to be positioned between various active devices so that the system timing and functionality is achieved. There have been a few innovations in the area of IPD (integrated passive devices) for various substrates like PCB, BCB, ceramic etc., but none in a Si interposer architecture.

FIG. 1 is a vertical section view representing a split substrate interposer with integrated passive devices, in accordance with an embodiment of the present disclosure. The split substrate interposer 1000 includes a first substrate A and a second substrate J joined at a substrate join interface 300 to form the integral interposer 1000. The first substrate A includes bulk material 110 having a wiring plane 120 formed thereon. The bulk material 110 may be a silicon wafer, but any suitable substrate material may be used. As seen in FIG. 1, the bulk material includes through-silicon vias or through-substrate vias (TSVs) 113 which extend from a first side of the bulk material 110 to a second side of the bulk material. Wiring plane 120 includes insulating material 121 having trenches 122 and vias 124 formed therein. Deep trenches 126 may be included in the wiring plane 120 in accordance with power handling and global routing requirements of the wiring plane. Electrical contacts 128 are provided on the wiring plane 120 to facilitate external connection of the wiring plane to electrical devices or internal connection to other substrates that make up the split substrate interposer.

The second substrate J also includes bulk material 210 having a wiring plane 220 formed thereon. The bulk material 210 includes TSVs 213 which extend from a first side of the bulk material 210 to a second side of the bulk material. In the embodiment of FIG. 1, a deep TSV 215 is provided to extend through the bulk material 210 and into the wiring plane 220. Wiring plane 220 includes trenches 222 and vias 224. Electrical contacts 228 and 229 are provided on the wiring plane to facilitate internal connection of the wiring plane 220 to the first substrate A and/or passive devices 250, as seen. In the embodiment of FIG. 1, passive devices 250 are electrically connected to contacts 229 and embedded within bulk material 110 at the join interface 300. Passive devices may include resistors, capacitors, inductors, coils and/or any combination of these devices, for example. Further, the passive devices may be standard commercially available devices or customized for a particular circuit design. Electrical contacts 230 are provided on the bulk substrate 210 to facilitate external connection of the second substrate 200 to electrical devices or internal connection to other substrates that make up the split substrate interposer.

Although FIG. 1 shows only two substrates, additional substrates may be joined to form an integral interposer.

A split substrate interposer such as that in FIG. 1 may provide several advantages over conventional substrate interposers. For example, the use of two or more interposer substrates enables embedding of the passive devices 250 to permit a smaller form factor system. Further, use of two or more interposer substrates provides structural rigidity to resist warping, and mechanical integrity that may enable the split substrate interposer to serve as a package substrate. Use of separate wiring planes for the substrates may also help to reduce the routing challenges presented by complex redistribution layers of conventional single substrate interposers. Further, the use of two or more interposer substrates effectively provides for higher aspect ratio TSVs than conventional interposers. Specifically, as seen in the example of FIG. 1, TSV 215 in the second substrate J can be aligned and joined with a TSV 113 in the first substrate A to effectively form a high aspect ratio TSV that would be difficult or impossible to achieve with conventional single substrate interposer techniques.

Techniques herein also provide methods for forming a split substrate interposer. One criticism of conventional silicon interposers is that multilayer wiring planes are sequentially formed on a single substrate which limits available process technologies applied to portions of the interposer that will accommodate different electrical devices. Further, through silicon vias (TSVs) become difficult to form and require expensive processes as the interposer increases in complexity. For example, deep TSVs are difficult to etch and require long process times for thin Si substrates, while providing shallow TSVs in relatively thin substrates may lead to warping problems.

Methods herein provide an interposer that solves challenges of diverse and 3D integration. Interposers herein split a final interposer into multiple layers which enables concurrent processing of separate substrates that can be tuned to the respective attached devices. The passive devices are selected in wafer form and pre-processed to desired thickness by CMP (chemical mechanical polishing), DRIE (deep reactive ion etching) or back-grinding. Then passive devices are die attached on the interposer RDL (redistribution layer) final layer, with designed cavities or trenches made by DRIE. The separate substrates can then be bonded on a common multilayered redistribution layer interconnect interface to create a 3D monolithic interposer in which components can be assembled all around with high area density, with interstitial high density interconnects, and with very low parasitic latency. The present inventors found that wafer bonding of separately processed substrates into an integral interposer can mitigate problems of conventional single substrate interposers.

Figure 2:
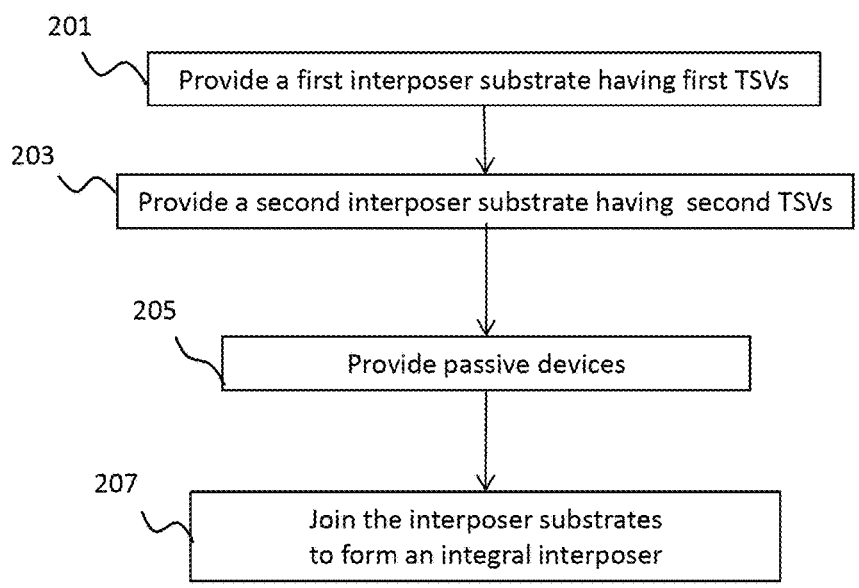
FIG. 2 is a flow diagram of a process of forming a split substrate interposer with integrated passive devices, in accordance with an embodiment of the present disclosure.

FIG. 2 is a flow diagram of a process of forming a split substrate interposer with an integrated passive device, in accordance with an embodiment of the present disclosure. The process begins in step 201 with providing a first interposer substrate that will be included in a final integral interposer structure. The first interposer substrate includes a first bulk material having one or more TSVs extending through the first bulk material. The first substrate may also include one or more wiring planes, one or more electrical contacts formed on a wiring plane, one or more electrical contacts formed on the first bulk substrate, or some combination of these elements.

Step 203 includes providing a second interposer substrate that will be included in a final integral interposer structure. The second interposer substrate includes a second bulk material having one or more second TSVs extending through the second bulk material. Further, a wiring plane is formed on the second bulk material such that the wiring plane is electrically connected to at least one of the second TSVs. The second interposer substrate may also include an additional wiring plane, one or more electrical contacts formed on a wiring plane, one or more electrical contacts formed on the second bulk substrate, or some combination of these elements. Electrical contacts of the first or second interposer substrates can facilitate external connection to electrical devices or internal connection to other substrates that make up the split substrate interposer.

Either or both of the first and second interposer substrates may be obtained as prefabricated substrates for assembly into an interposer by a split substrate interposer assembly process. For example, each of the interposer substrates may be prefabricated with one or more wiring planes, one or more TSVs, one or more electrical contacts, or some combination of these elements. Alternatively, all or portions of each of the interposer substrates may be fabricated as part of the overall process of producing the split substrate interposer. For example, forming a wiring plane can include steps such as depositing/forming oxide on a front side surface of the bulk substrate material. An etch mask formed by photolithography can be used to etch trenches and vias in the layer of oxide, such as by plasma-based anisotropic etching. These wiring openings can be filled with metal, such as copper, and then planarized using chemical-mechanical polishing (CMP) as part of a damascene metallization process. These steps can be repeated for any number of trenches and vias using various metal modules. Thus the wiring plane can have a single layer of trenches or multiple layers of trenches. Electrical contacts can be formed on a top surface of the wiring plane by known processes including using a self-aligned contact flow. Further, in the bulk material of each of the substrates, through-silicon-vias (TSV) or microTSVs can be formed.

In step 205, a passive device is provided. The passive device may be resistive, capacitive or inductive, or some combination of these elements. Further, the passive device may be provided as a prefabricated die for assembly into an interposer, or provided by forming the passive device as part of the process of forming the split substrate interposer.

In step 207, the first interposer substrate is joined to the second interposer substrate such that the wiring plane of the second substrate and the passive devices are provided between the first and second bulk materials. The passive devices may be fully embedded within the split substrate interposer, or confined to cavities formed at the interface of the first and second interposer substrates. The wiring plane of the second substrate serves as an interface wiring plane that electrically connects at least one of the first TSVs of the first substrate to at least one of the second TSVs of the second substrate. In some embodiments, Sn:Ag:Cu (SAC) alloy contacts are provided at the join interface to facilitate electrical connection of the wiring plane to the TSVs. Alternatively, copper-to-copper direct bonding techniques may be used to join the TSVs and wiring plane metal. Direct or indirect wafer bonding methods may be used to join the plurality of substrates into a split substrate interposer.

Embodiments herein can be tailored to specific device needs. In one embodiment, this customization can be implemented by using a conventional EDA (electronic design automation) platform where fabrication design rules and final system electrical, thermal design rules along with various component specifications are incorporated. An architecture is then fabrication using conventional silicon fabrication processing steps such as lithography, etch, thin film deposition, and wafer bonding to yield an advanced interposer. This advanced interposer can be manufactured in high volume with high reliability. Accordingly, methods herein enable higher integration density, lower parasitic latency, and higher yield and cost.

Techniques herein provide a method for fabricating advanced interposer designs. Interposers herein split a final or complete interposer into two or more layers, which enables concurrent processing tuned to the respective attached devices. Interposers herein include embedded passive devices that are integrated with a given interposer. As can be appreciated, various types of passive devices and amounts of passive devices can be included in a given interposer herein. Passive devices to be embedded or integrated with the interposer can be designed and tuned to match a particular circuit, and can be fabricated on silicon, glass, ceramic wafers, or other substrates. Passive devices can be embedded within interposers herein by using, for example, recesses formed within the interposer. These recesses can be initially formed within individual component interposer substrates prior to joining into a combined or complete interposer herein. In some embodiments, interposers are formed with two or more redistribution layers separated by silicon or dielectric material or other spacing material. This split RDL configuration enables customization and compact designs. Thin film, etch processes, and dual damascene techniques can be used when forming individual interposer substrates, passive devices, and embedding passive device within the interposer. Passive circuits can be attached to component interposer substrates by die bonding or other attachment techniques.

Accordingly, interposers herein, with multiple levels of silicon and embedded or integrated passive devices, can provide an electrical interface with a scaling reduction of 25% or more because of efficient interconnect and placement designs enabled herein. A given motherboard has areas of digital integration, power supply, and radio frequency (RF) integration, as well as future photonics integration and other functionality. These designs are typically RCL circuits (resistor (R), inductor (L), capacitor (C)) with filters to enable a given circuit to function as designed and simulated. Given designs may also account for (compensate for) interconnect and other ambient conditions. One disadvantage of conventional interposer architectures is that they are fabricated sequentially, which makes circuit formation complex and expensive. Moreover, yields can be low with one error in specification or processing down the line resulting in significant device rejections. In contrast, the split interposer architecture herein uses a concurrent processing architecture in that different process blocks or circuit blocks are made separately and finally integrated by wafer bonding to deliver a compound device with passive devices integrated therein.

Passive devices, as the name suggests, are passive in that they are slaves to an active chip(s) or device(s) (digital, analog, or RF) around the passive devices. Designs herein adjust signal delays and eliminate parasitic latency, for example. Techniques herein include fabricating passive circuits based on a design (which can be made separately using conventional processes). Adjustments can be made for substrate parametric values after identifying from the design. The multi-level or multi-plane interposer can then be formed with embedded passive devices. Passive devices can be embedded within an RDL plane or between RDL planes, or within bulk substrate material. If any inaccuracies or parasitics are identified, then integration can be adjusted-including adjustments to passive devices themselves and/or position within the interposer—to improve yield. In an RCL circuit around a digital environment (and especially an RF environment), the parasitic variances become more difficult to adjust. Accordingly, while designing herein for passive devices there can be some redundancy. A laser can be used herein to trim values of RCL components for fine tuning. With this method, on line testing can be executed and then fine tuning executed, and then passive devices assembled. This new method for interposer-based manufacturing significantly improves chip design, functionality, and size.

Figure 3A:
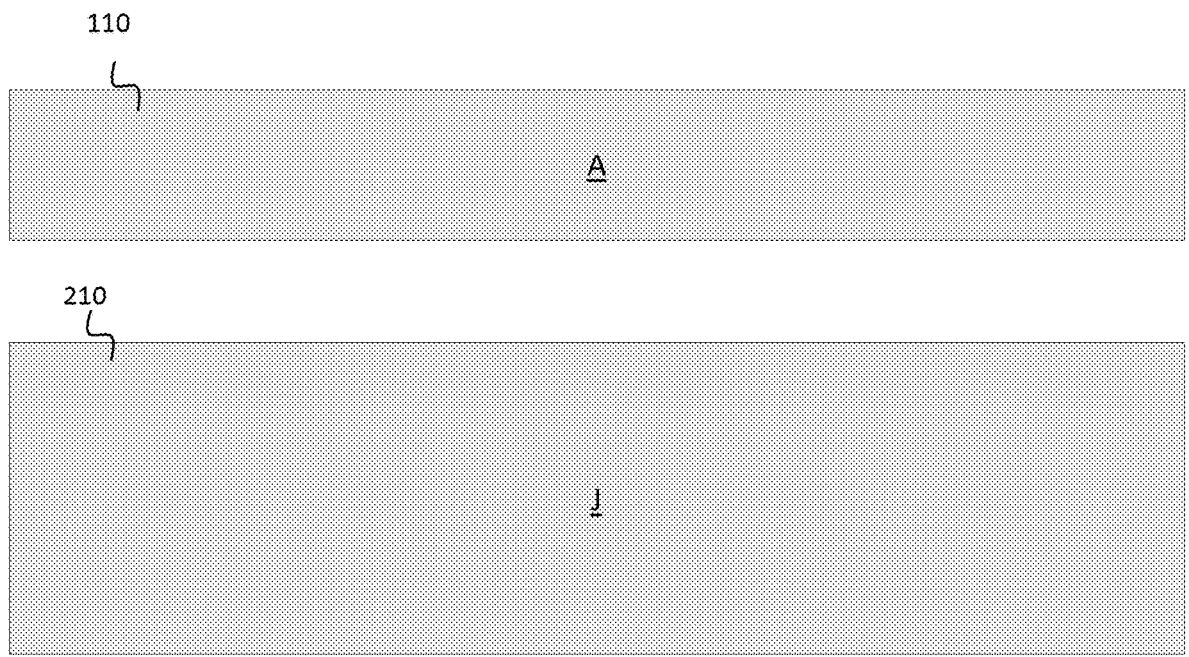
FIGS. 3A, 3B, 3C, 3D, 3E, 3F, 3G, 3H and 3I are vertical section views representing intermediate structures of a split substrate interposer with integrated passive devices, in accordance with an embodiment of the present disclosure.
Figure 3B:
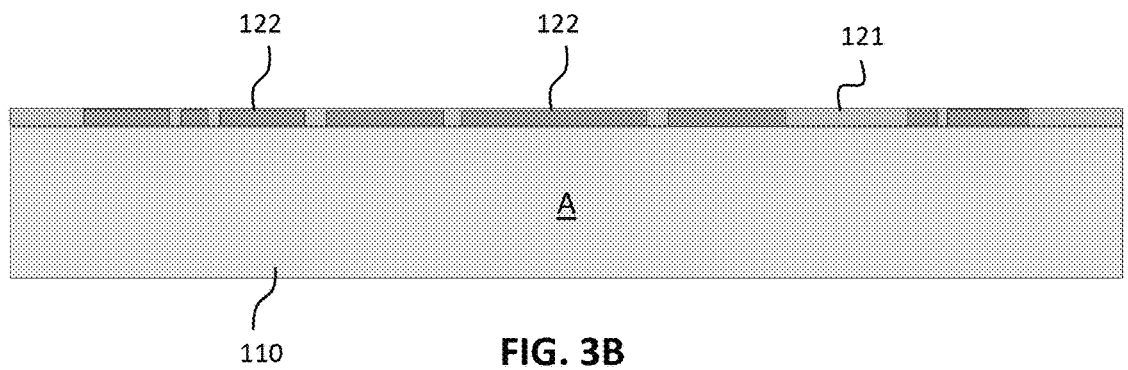
Figure 3C:
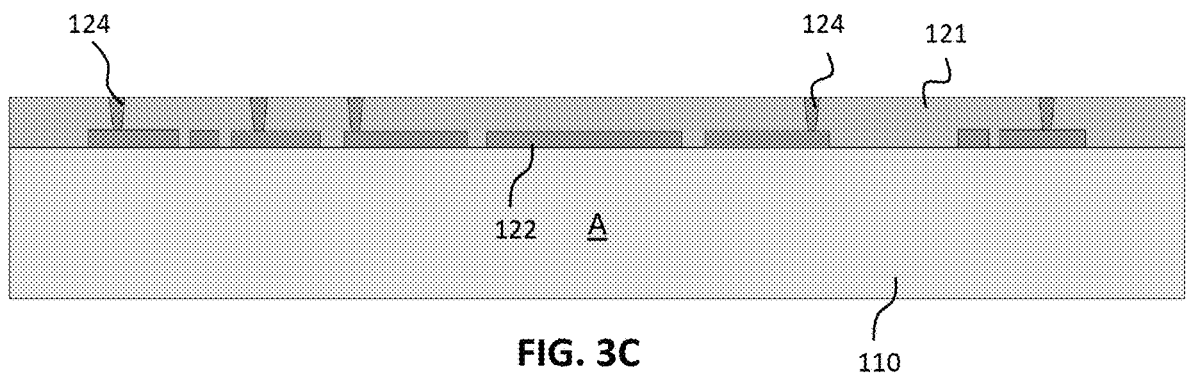

FIGS. 3A-3I show vertical section views of intermediate structures in a process of forming the split substrate interposer of FIG. 1, in accordance with one embodiment of the present disclosure. As seen in FIG. 3A, a first substrate A of bulk Si material 110 and a second substrate J of bulk Si material 210 are provided. The Si substrates A and J are processed separately before being joined with each other as discussed further below. Such processing may be performed either concurrently or sequentially. In the embodiment of FIG. 3A-3I, first wiring plane 120 is formed on the first bulk substrate material 110 of the substrate A. Forming the first wiring plane 120 can include performing alternate metal and via process modules as shown in FIGS. 3B and 3C respectively. Specifically, the metal module of FIG. 3B may include depositing/forming oxide 121 on a front side surface of the first substrate A, and using an etch mask (not shown) formed by photolithography to etch trench openings in the oxide 121 by conventional etch processes such as by plasma-based anisotropic etching. These trench openings can be filled with metal, such as copper, and then planarized using chemical-mechanical polishing (CMP) as part of a damascene metallization process to form the trench metal structure 122. Similarly, the via process module of FIG. 3C may include depositing/forming oxide 121 on the trenches 122 of the front side surface of the first substrate A. A via etch mask (not shown) formed by photolithography is used to etch via openings in the oxide by conventional etch processes such as by plasma-based anisotropic etching. These via openings can be filled with metal, such as copper, and then planarized using chemical-mechanical polishing (CMP) as part of a damascene metallization process to form the metal via structure 124. A via liner (not shown) may be provided in the via opening prior to copper fill.

Figure 3D:
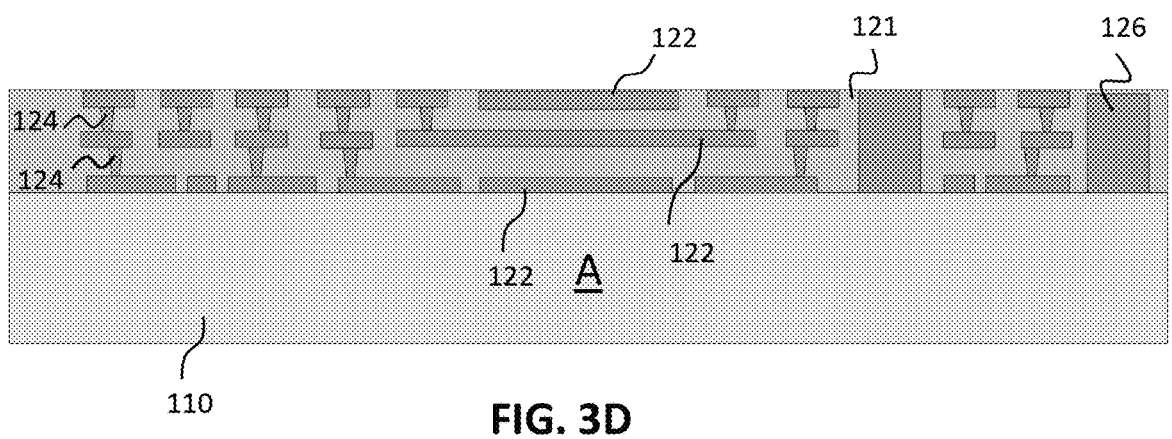

These steps of the metal module in FIG. 3B and the steps of the via module of FIG. 3C can be repeated for any number of trenches and vias using various metal modules. Thus, the wiring plane can have a single layer of trenches and vias, or multiple layers of trenches and vias. FIG. 3D shows a wiring plane having three trench metal layers 122 and two via metal layers 124. As seen in FIG. 3D, deep vias 126 may be provided in the wiring plane as needed for power handling and/or global routing, for example.

Figure 3E:
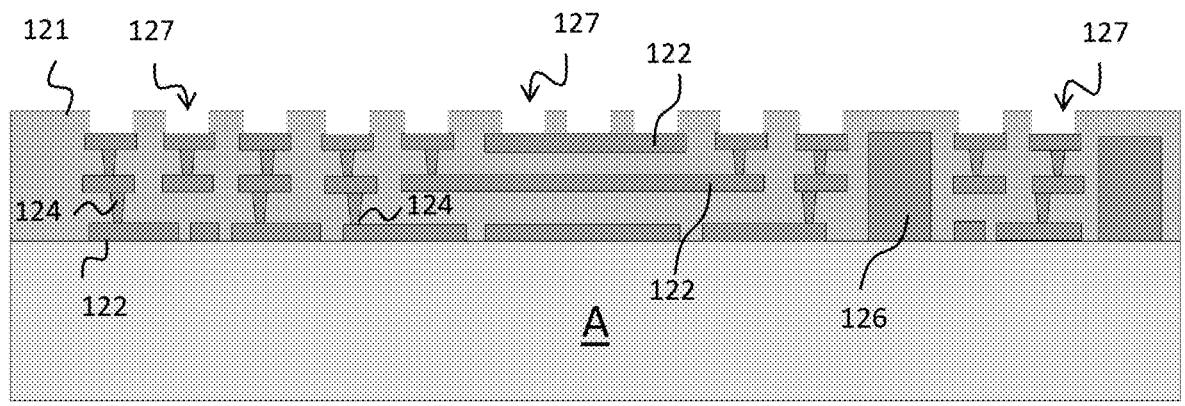
Figure 3F:
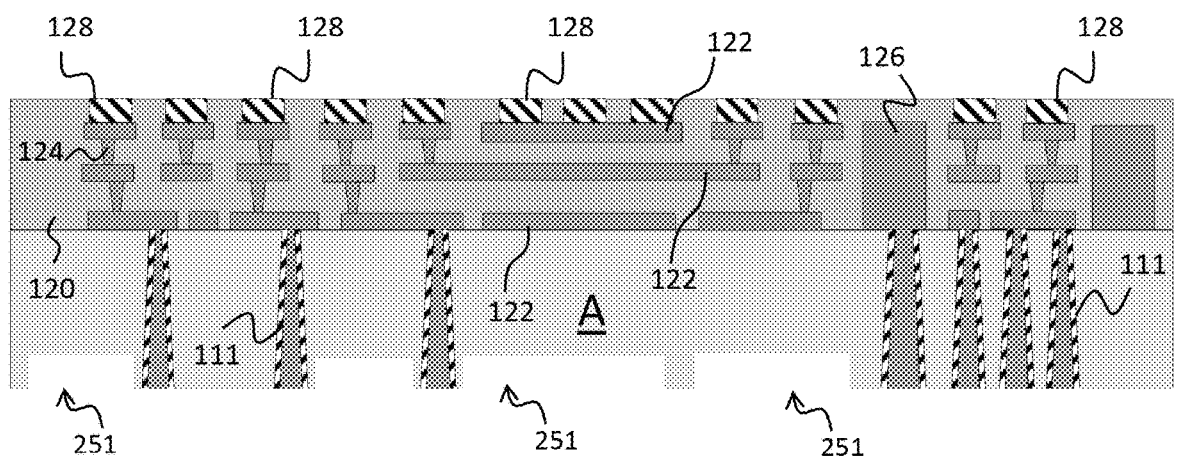

Electrical contacts can be formed on a top surface of the wiring plane as shown in FIGS. 3E and 3F. These electrical contacts can be formed using a self-aligned contact flow. In the embodiment described, oxide 121 is formed over the final trench metal layer 122, and contact openings 127 are formed in the oxide as shown in FIG. 3E. Contact openings 127 may then be filled with conductive material to form electrical contacts 128 of FIG. 3F. In some embodiments the contact openings 127 may be filled with a tin-silver-copper alloy also known as SAC alloy. In the embodiment described, the wiring plane 120, including contacts 128, forms a redistribution layer (RDL). In one example embodiment, the Si substrate bulk material 110 is about 500 μm thick, and the RDL is about 10 μm thick.

As also shown in FIG. 3F, through-silicon-vias (TSV) or micro TSVs can be formed in the bulk material 110 of the substrate A. Specifically, the backside of substrate A may be pattern etched to form TSV openings, and a conformal coat of liner material 111 formed in such openings. The openings are further filled with metal 112, such as copper, to provide the TSVs 113. These vias connect the first wiring plane to a backside surface of the first substrate A.

Figure 3G:
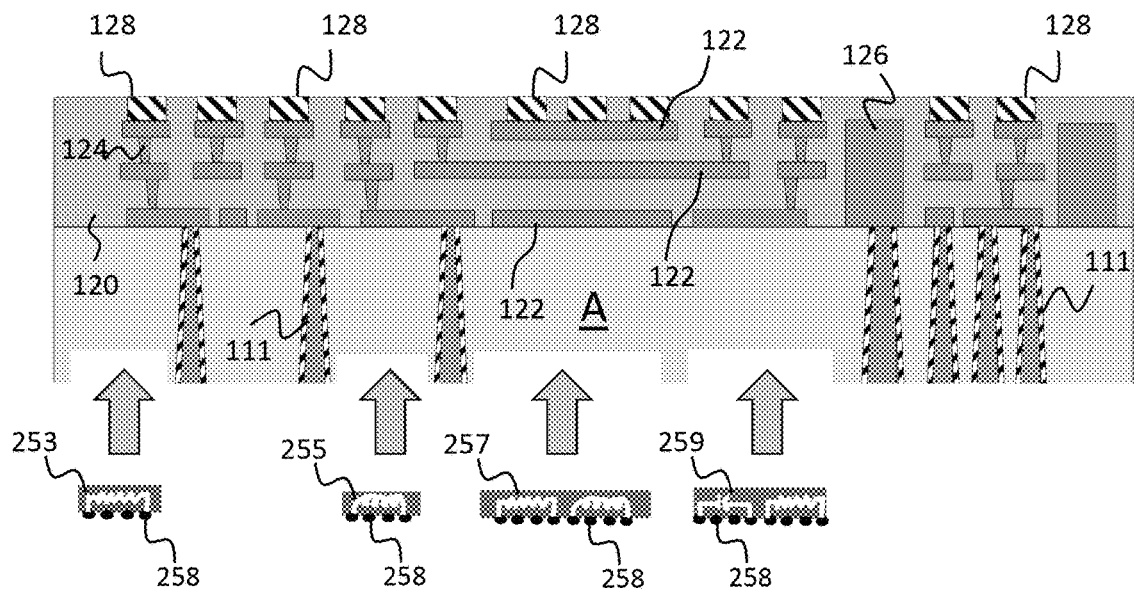

Openings 251 for the passive devices are formed or cut in the backside of substrate A as also shown in FIG. 3F. Each opening or recess can be a different size depending on a particular passive device designed to be positioned therein. In some embodiments, the openings 251 may be between approximately 1000 μm and 2000 μm wide. In FIG. 3G, passive devices are positioned within the openings as shown by the arrows. In some embodiments, the passive device may be a resistor device 253 or inductor device 255. The passive device may also be a combination of different passive devices in an integrated package such as the resistive inductive device 257 and the resistive-capacitive device 259. Passive devices can be affixed within the openings if desired. Thus, the passive devices 250 may be considered as a part of substrate A.

Figure 3H:
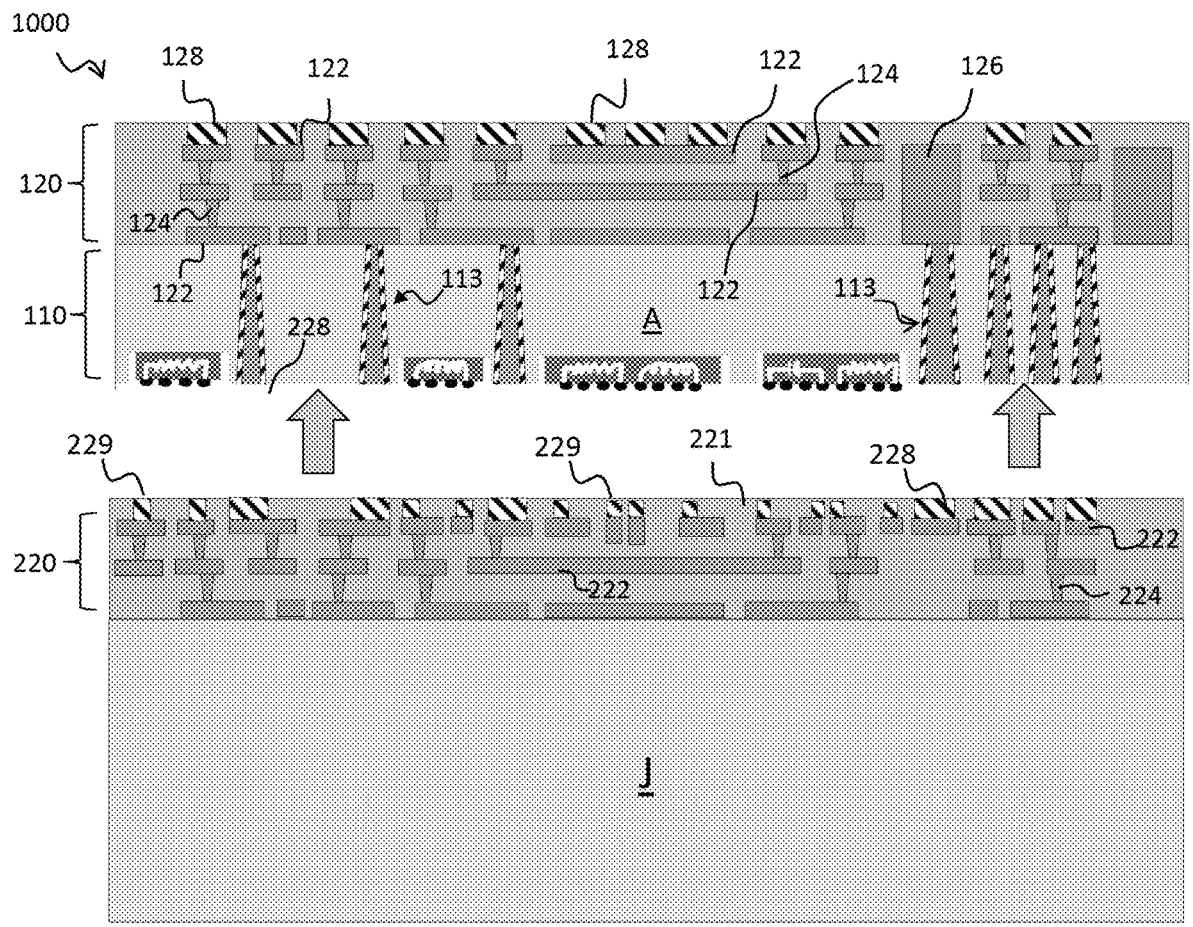

As noted above, the second substrate J is processed separately from substrate A. As seen in FIG. 3H, the second wiring plane 220 is formed on bulk Si material 210. The second wiring plane 220 includes insulation 221, three trench metal layers 222, two via metal layers 224, and electrical contacts 228 and 229 to form a RDL, similar to the first wiring plane 120 on substrate A. Electrical contacts 228 are sized to connect with vias 113, which may be 50 μm wide. Electrical contacts 229 may be sized to connect with contacts of the passive devices 250, which may be smaller than the contacts 228.

The two processed wafers A and J are then aligned and joined together as represented by the arrows in FIG. 3H. In this joining process, the contacts 228 of the second wiring plane 220 align with the through-substrate vias 113 of the first substrate A, and the passive devices 250 electrically connect with the contacts 229 of the second redistribution layer. Note that the passive devices can also physically/mechanically connect to the second redistribution layer and/or first interposer substrate.

Figure 3I:
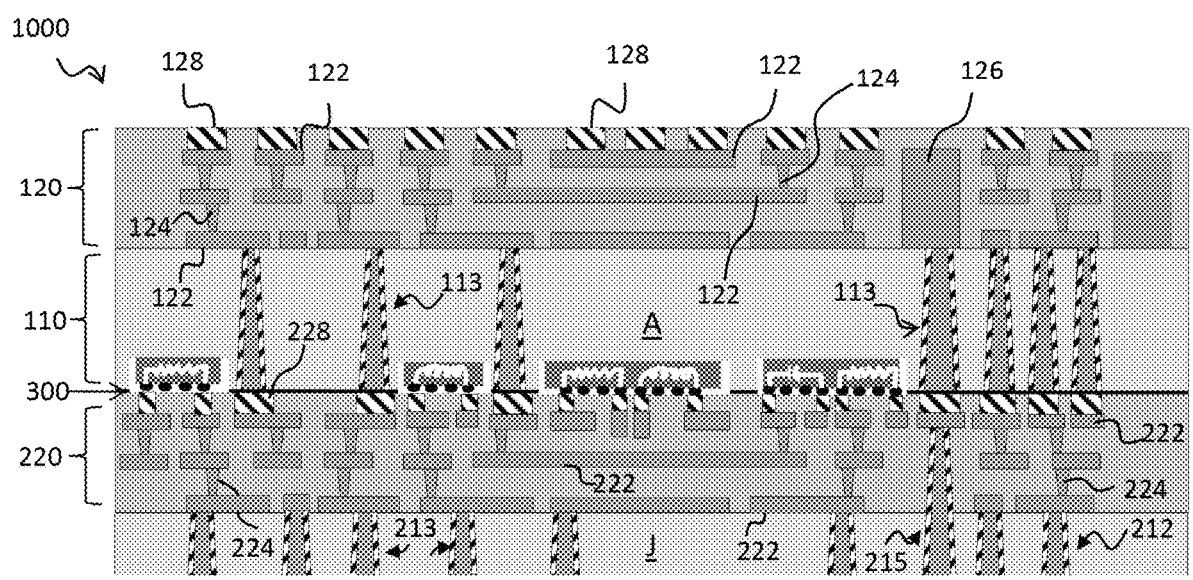

With the substrates joined, through-substrate vias 213 can be added to the backside of substrate J as shown in FIG. 3I. In this embodiment, a thickness of the bulk material 210 is first reduced by processing of the backside of the bulk material 210. TSVs 213 are then formed by processing the backside of the bulk material 210. Specifically, as seen in FIG. 3I, the backside of substrate J may be etched to form TSVs 213, and deep TSVs 215. Finally, electrical contacts 230 are formed to provide the split substrate interposer shown in FIG. 1. Accordingly an interposer is formed with two redistribution layers (RDL), and a customized layout.

Figure 4A:
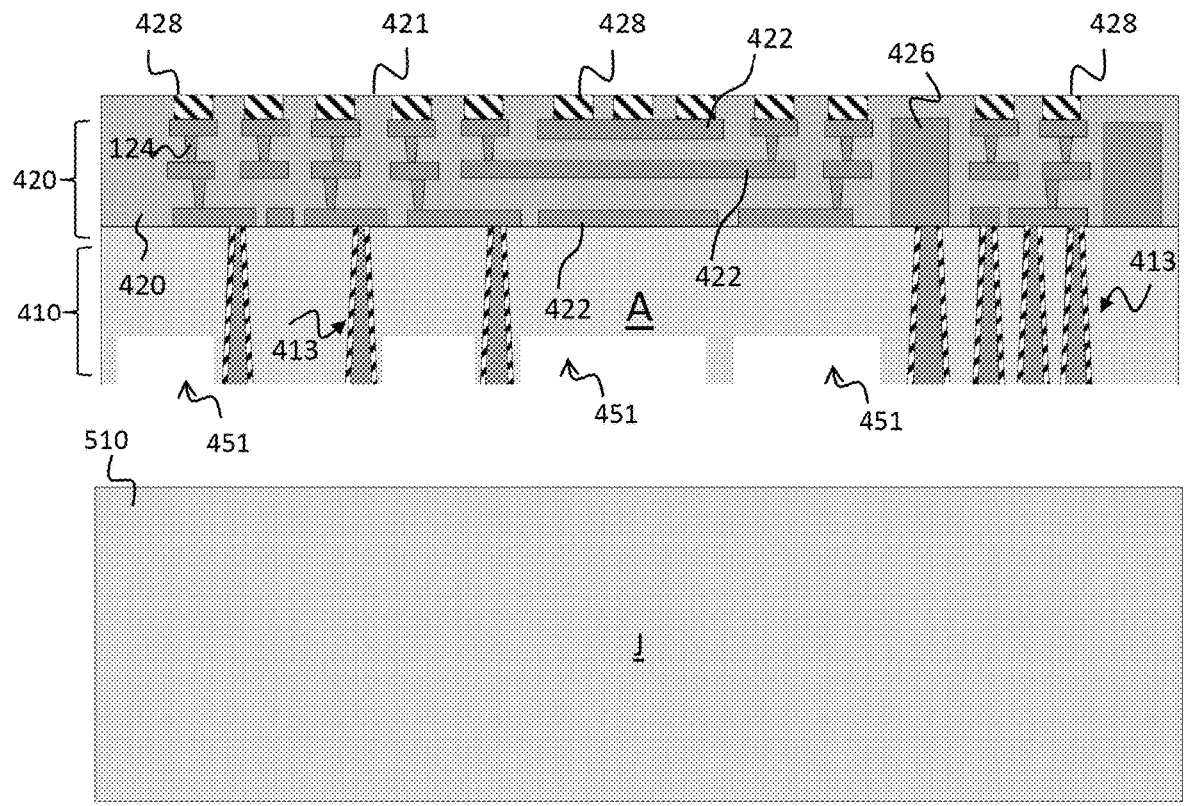
FIGS. 4A, 4B, 4C and 4D are vertical section views representing intermediate structures of a split substrate interposer with integrated passive devices, in accordance with an alternative embodiment of the present disclosure.

FIGS. 4A-4D are vertical section views of intermediate structures in a process of forming split substrate interposer in accordance with another embodiment of the present disclosure. As seen in FIG. 4A, the process begins with providing a plurality of substrates A and J. The first substrate A includes bulk material 410 having a wiring plane 420 formed thereon. The bulk material 410 may be a Si wafer, and includes through silicon vias (TSVs) 413 which extend from a first side of the bulk material 410 to a second side of the bulk material. Wiring plane 420 includes insulating material 421 having trenches 422 and vias 424 formed therein. Deep trenches 426 may be included in the wiring plane 420 in accordance with power handling and global routing requirements of the wiring plane. Electrical contacts 428 are provided on the wiring plane 420 to facilitate external connection of the wiring plane to electrical devices or internal connection to other substrates that make up the split substrate interposer. Openings 451 are provided on a back side of the first substrate. Processing of substrate A in FIG. 4A is similar to FIGS. 3A-3F and like techniques can be used for fabrication. However, in the embodiment of FIGS. 4A-4D, passive devices 250 are mounted on substrate J before joining of the substrates.

Figure 4B:
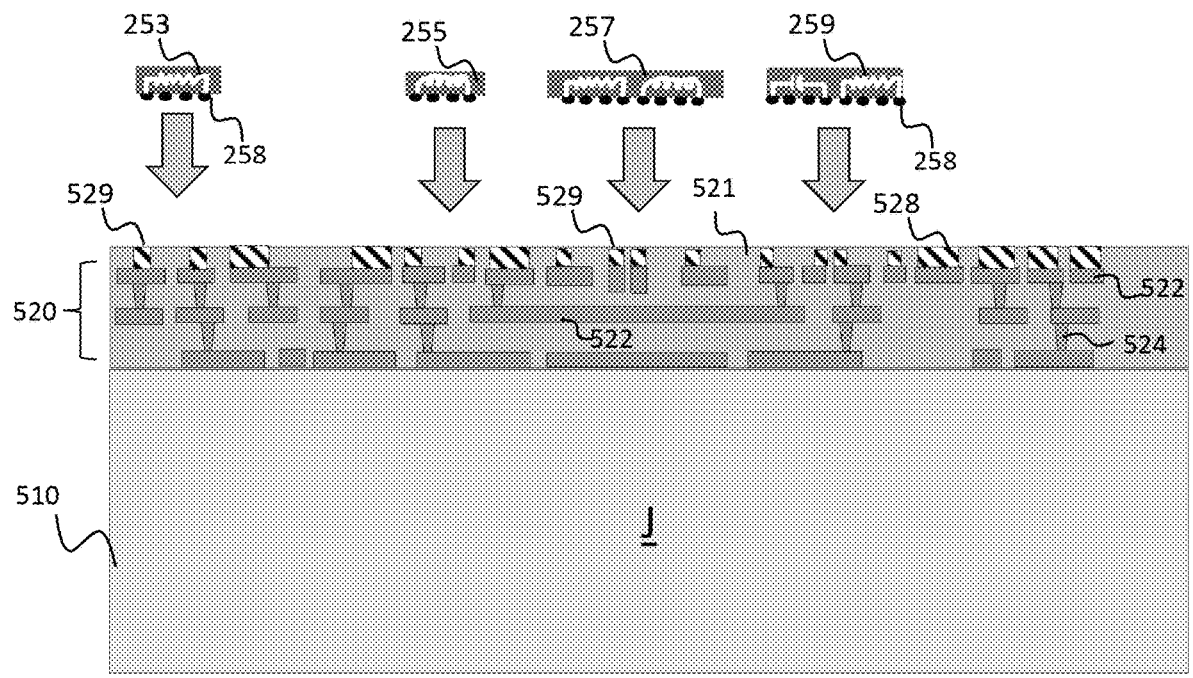
Figure 4C:
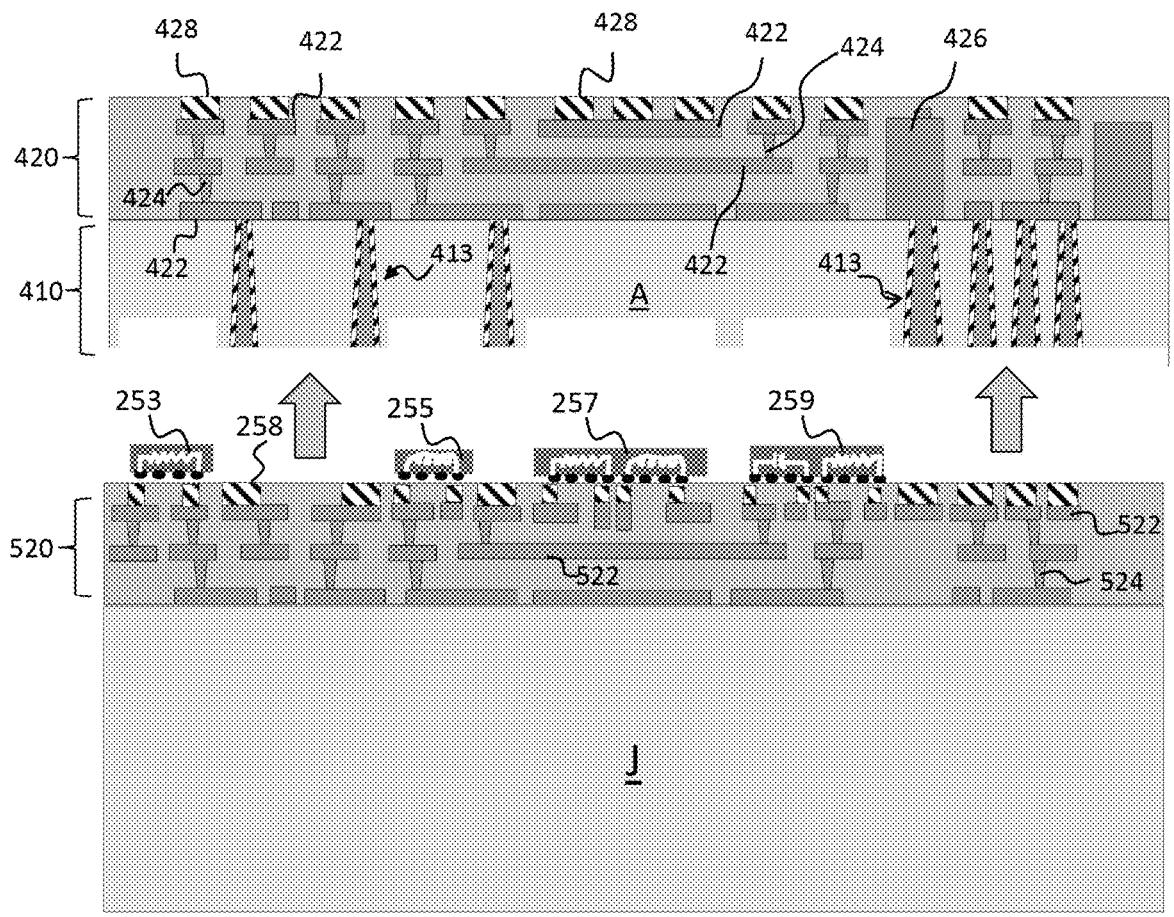

As seen in FIG. 4B, RDL 520 is formed on substrate J, followed by a process flow, such as self-aligned contact, to add electrical contacts 528 and 529. Passive devices 253, 255, 257 and 259 are mounted on the electrical contacts 529 by solder, for example. Next, the two wafers are aligned and joined so that the second redistribution layer 520 (wiring plane) aligns with the through-substrate vias 413 of the first substrate, and the passive devices 253, 255, 257 and 259 align an fit within respective recesses formed in substrate A, as seen in FIG. 4C.

Figure 4D:
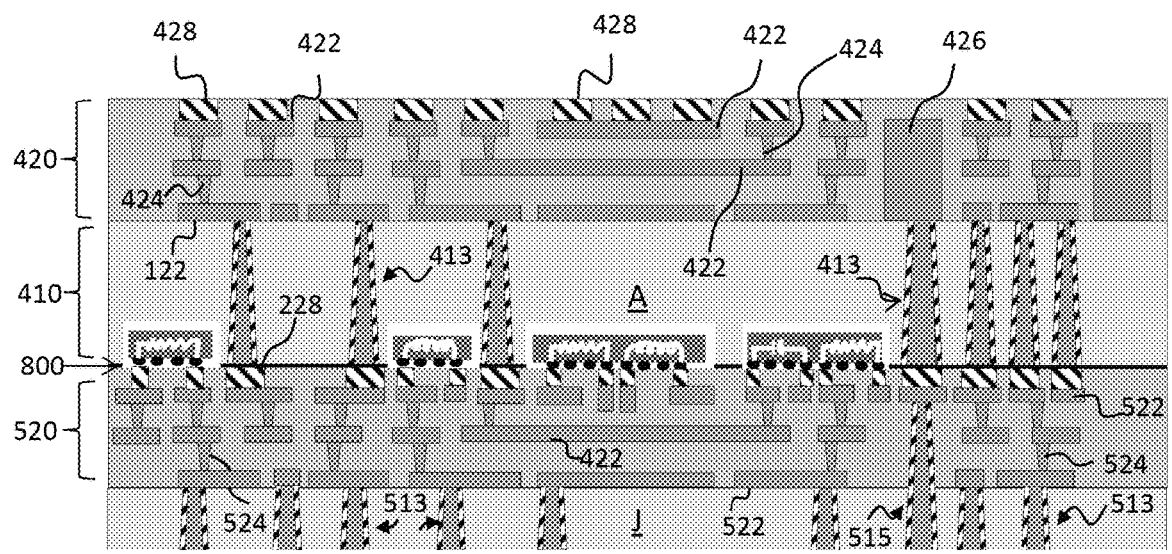

With the substrates joined, through-substrate vias 513 can be added to the backside of substrate J as shown in FIG. 4D. In this embodiment, a thickness of the bulk material 510 is first reduced by processing of the backside of the bulk material 510. TSVs 513 are then formed by processing the backside of the bulk material 50. Specifically, as seen in FIG. 3I, the backside of substrate J may be etched to form TSVs 513, and deep TSVs 515. Finally, electrical contacts 230 are formed to provide the split substrate interposer shown in FIG. 1. Accordingly an interposer is formed with two redistribution layers (RDL), and a customized layout.

Figure 5A:
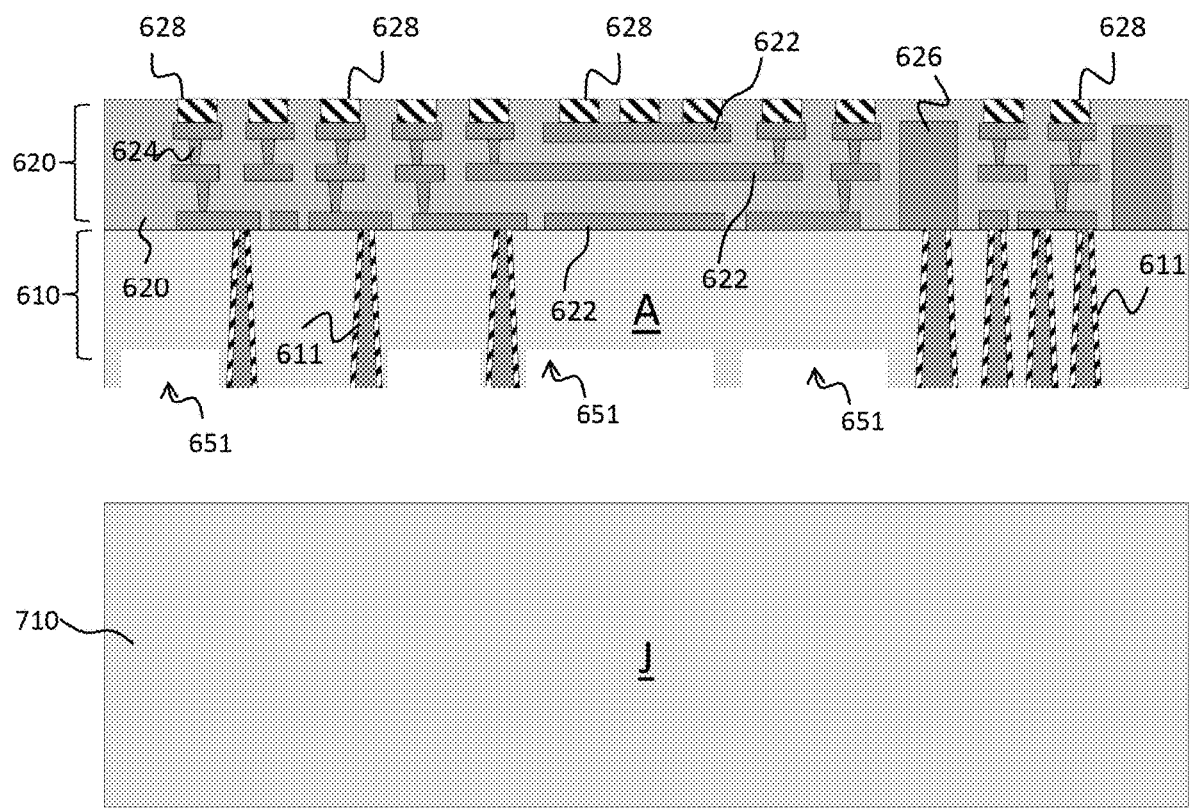
FIGS. 5A, 5B, 5C, 5D, 5E and 5F are vertical section views representing intermediate structures of a split substrate interposer with integrated passive devices, in accordance with an alternative embodiment of the present disclosure.

FIGS. 5A-5F are vertical section views of intermediate structures in a process of forming split substrate interposer in accordance with another embodiment of the present disclosure. As seen in FIG. 5A, the process begins with providing a plurality of substrates A and J. The first substrate A includes bulk material 610 having a wiring plane 620 formed thereon. The bulk material 610 may be a Si wafer, and includes through silicon vias (TSVs) 613 which extend from a first side of the bulk material 610 to a second side of the bulk material. Wiring plane 620 includes insulating material 621 having trenches 622 and vias 624 formed therein. Deep trenches 626 may be included in the wiring plane 620 in accordance with power handling and global routing requirements of the wiring plane. Electrical contacts 628 are provided on the wiring plane 620 to facilitate external connection of the wiring plane to electrical devices or internal connection to other substrates that make up the split substrate interposer. Openings 651 are provided on a back side of the first substrate. Processing of substrate A in FIG. 5A is similar to FIGS. 3A-3F and like techniques can be used for fabrication. However, in the embodiment of FIGS. 5A-5E, TSVs are formed by etching a front side of the second substrate and passive devices are mounted on substrate J before joining of the substrates.

Figure 5B:
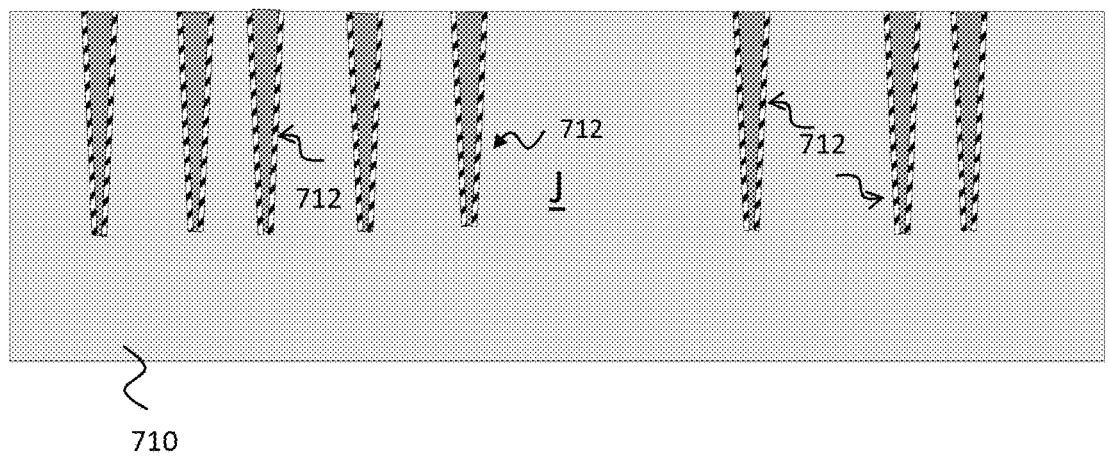
Figure 5C:
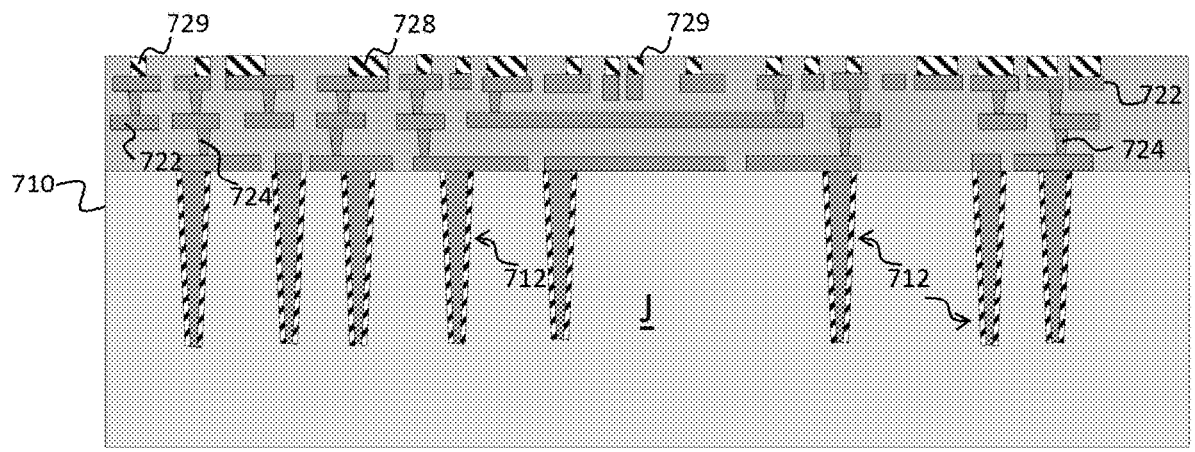

As seen in FIG. 5B, vias 712 are formed in the top side of substrate J prior to joining with substrate A. These vias 712 can extend partially into the substrate J, and can be relatively longer vias, like TSVs, but without extending completely through the bulk substrate material 710. The vias 712 are formed by a pattern etching process similar to that of the TSVs 413. Then a second RDL 720 can be added to substrate J with corresponding electrical contacts with the result shown in FIG. 5C. Processes for forming the second RDL may be similar to those described above with respect to the wiring planes in FIGS. 3A-3I. 5IG. 4C shows this RDL 720 with three layers of metal trenches and vias, but this is non-limiting and more or less layers of metal can be formed.

Figure 5D:
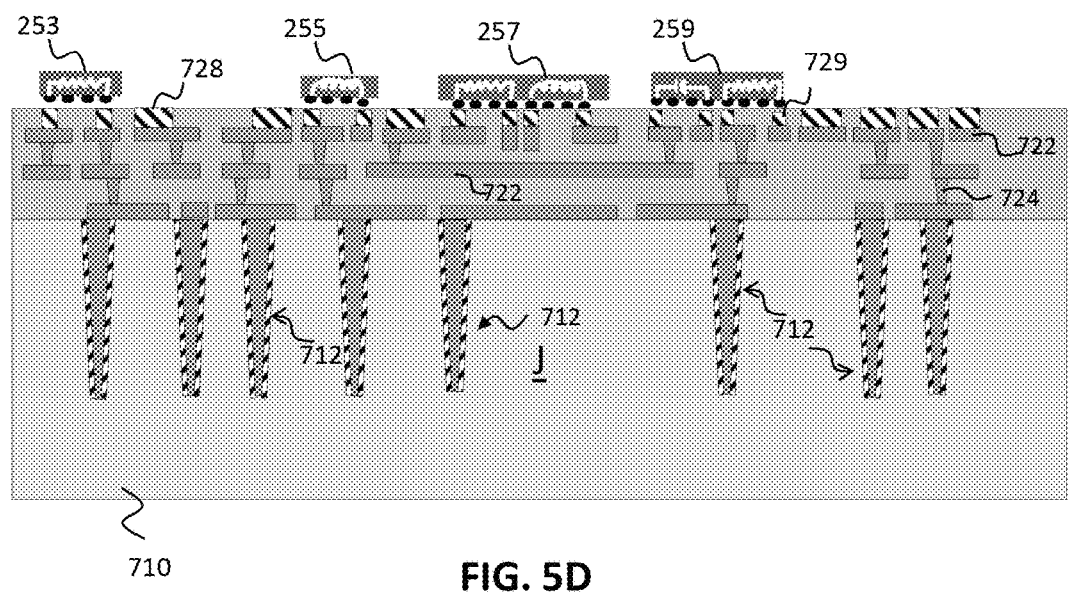
Figure 5E:
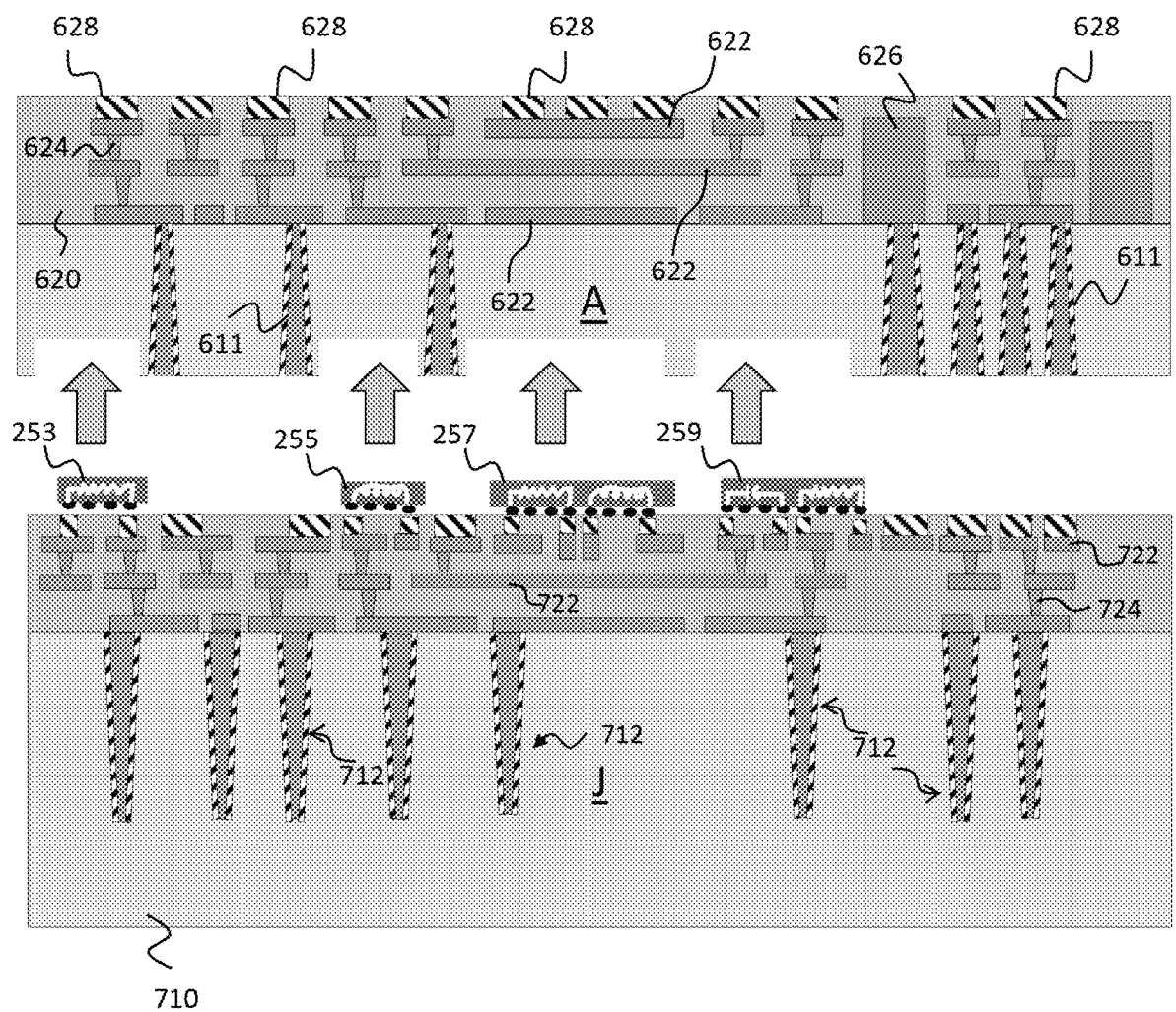

RDL 720 is formed on substrate J, followed by a process flow, such as self-aligned contact, to add electrical contacts 728 and 729. Passive devices 253, 255, 257 and 259 are mounted on the electrical contacts 729 by solder, for example, as shown in FIG. 5D. Next, the two wafers are aligned and joined so that the second redistribution layer 720 (wiring plane) aligns with the through-substrate vias 713 of the first substrate, and the passive devices 253, 255, 257 and 259 align an fit within respective recesses formed in substrate A, as seen in FIG. 5E.

Figure 5F:
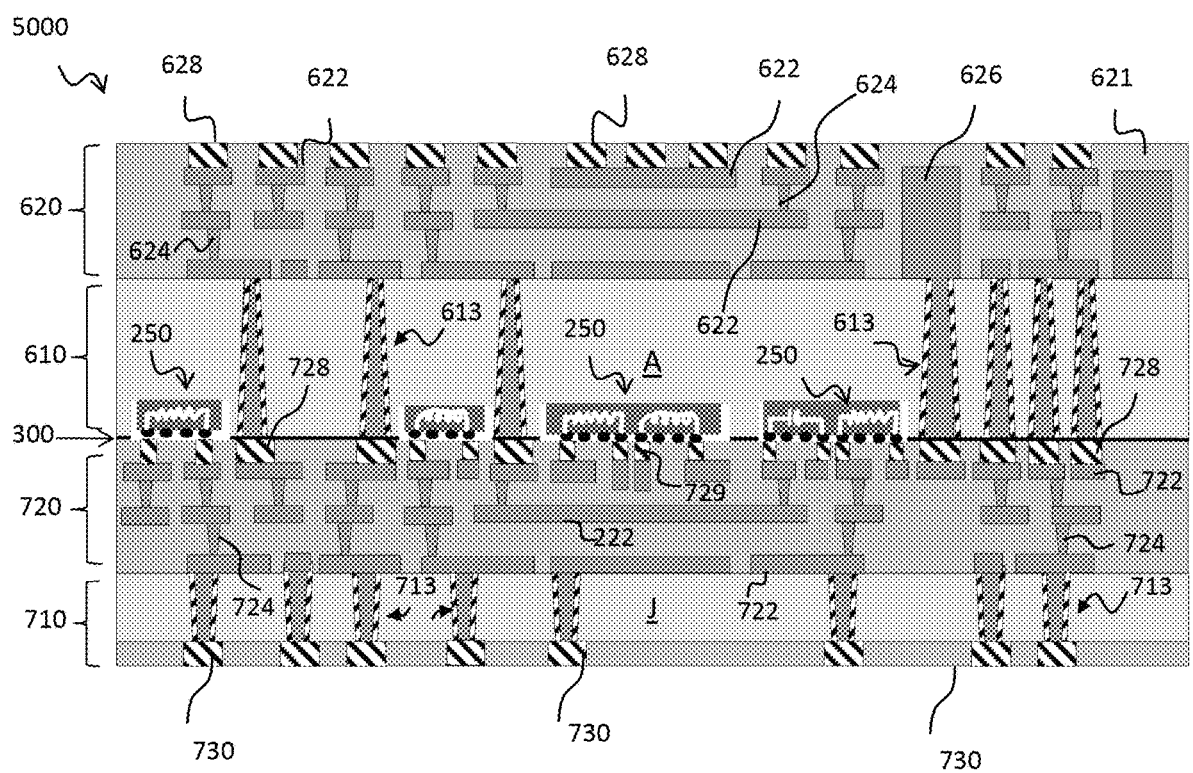

With the substrates joined, the backside of substrate J can be grinded or planarized until uncovering the vias 712 to form through-substrate vias 713 in the bulk material 710 of substrate J. Electrical contacts 730 can be formed such as by depositing oxide, patterning the oxide, and depositing a desired metal by self-aligned contact (SAC) fabrication. Accordingly an interposer 7000 is formed with two redistribution layers (RDL), and customized layout as shown in FIG. 5F.

The split interposer architecture herein enables concurrent processing for system integration. Two interposers are bonded to maximize TSV aspect ratio and minimize complex RDL routing challenges. This split silicon interposer provides an interposer with mechanical integrity for dual use as a system substrate, thereby eliminating the need for a substrate. Moreover, the split silicon interposer herein enables device mounting on all sides of the final system in package allowing higher level of 3D integration, thermal management and mechanical strength.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming an interposer, the method comprising:
   providing a first interposer substrate comprising a first bulk silicon material having opposing planar surfaces, and a plurality of first through silicon vias (TSVs) extending through the first bulk silicon material such that opposite ends of the first TSVs are substantially co-planar with a respective opposing planar surface, wherein one of the opposing planar surfaces of the first bulk silicon material includes a first planar joining surface;
   providing a second interposer substrate comprising a second bulk silicon material having a plurality of second TSVs extending through the second bulk silicon material, and a wiring plane formed on the second bulk silicon material such that the wiring plane is electrically connected to at least one of the second TSVs, wherein the wiring plane includes a second planar joining surface;
   forming a device recess in the first planar joining surface of the first bulk silicon material;
   connecting a passive electrical device to at least one of the first and second interposer substrates; and
   joining the first interposer substrate to the second interposer substrate such that at least a portion of the first planar joining surface is in direct contact with the second planar joining surface and the passive electrical device is provided within the device recess between the first and second interposer substrates and the wiring plane is provided as an interface wiring plane between the first and second bulk silicon materials, wherein the interface wiring plane is electrically connected to the passive electrical device and electrically connects at least one of the first TSVs to at least one of the second TSVs.

2. The method of claim 1, further comprising forming the device recess between adjacent first TSVs.

3. The method of claim 2, wherein the connecting comprises connecting the passive electrical device to the first interposer substrate within the device recess prior to the joining.

4. The method of claim 2, wherein:
   the connecting comprises connecting the passive electrical device to the wiring layer of the second interposer substrate prior to the joining, and
   the joining comprises joining the first interposer substrate to the second interposer substrate such that the passive electrical device is provided within the device recess.

5. The method of claim 1, further comprising providing a plurality of external contacts formed on at least one of a side of the first interposer substrate which is opposite to a join interface between the first and second interposer substrates and a side of the second interposer substrate which is opposite to the join interface.

6. The method of claim 5, wherein the providing a plurality of external contacts comprises providing electrical contacts configured to connect to at least one of a die, a package substrate and a printed circuit board.

7. The method of claim 1, further comprising:
providing the first silicon interposer substrate including an external wiring plane formed on an opposing planar surface of the first bulk silicon material which is opposite to the first planar joining surface, and a plurality of first external electrical contacts formed on the external wiring plane, and
providing the second silicon interposer substrate including a plurality of second external electrical contacts on a side of the second bulk silicon material that is opposite to the interface wiring plane, and a plurality of interface contacts formed in the interface wiring plane such that each of the plurality of interface contacts includes an exposed surface that is coplanar with the second planar joining surface and joins to a respective first TSV or the passive device as part of the joining.

8. The method of claim 1, wherein at least one of the first interposer substrate and the second interposer substrate is provided as a prefabricated substrate.

9. The method of claim 1, further comprising forming the second TSVs in the second interposer substrate to extend from a back side surface of the second bulk silicon material to a front side surface of the second bulk silicon material on which the wiring layer is formed.

10. The method of claim 9, wherein the forming second TSVs comprises:
prior to the forming the wiring plane, forming partial vias in the second bulk silicon material by processing the front side surface of the second bulk silicon material, wherein the partial vias do not extend to the back side surface of the second bulk silicon material;
after the joining, reducing a thickness of the second interposer substrate by processing the back side surface of the second bulk silicon material to expose the partial vias such that the partial vias become the second TSVs which extend from the back side surface of the second bulk silicon material to the front side surface of the second bulk silicon material.

11. An interposer comprising:
a first substrate comprising first bulk silicon material having opposing planar surfaces and a plurality of first TSV extending through the first bulk silicon material such that opposite ends of the first TSVs are substantially coplanar with the respective opposing planar surfaces, wherein one of the opposing planar surfaces of the first bulk silicon material includes a first planar joining surface having a device recess formed therein;
a second substrate comprising second bulk silicon material having a second TSV extending through the second bulk silicon material and a wiring plane formed on the second bulk silicon material in electrical contact with the first TSV, wherein the wiring plane includes a second planar joining surface;
a join interface connecting the first and second substrates such that the first planar joining surface of the first substrate physically contacts the second planar joining surface of the wiring plane of the second substrate, and the first TSVs are electrically connected to the second TSVs through the wiring plane; and
a passive electrical device provided within the device recess integrated within the interposer at the join interface, wherein the passive electrical device is electrically connected to the wiring plane.

12. The interposer of claim 11, wherein the first bulk silicon material and the second bulk silicon material each consists of Si.

13. The interposer of claim 11 further comprising:
a plurality of first external electrical contacts provided on a side of the first substrate that is opposite to the join interface, and
a plurality of second external electrical contacts provided on a side of the second substrate that is opposite to the join interface.

14. The interposer of claim 13, wherein the first and second external electrical contacts comprise electrical contacts configured to connect to at least one of a die, a package substrate and a printed circuit board.

15. The interposer of claim 11, further comprising a plurality of interface contacts provided at the join interface between the first and second substrates, wherein each of the interface contacts is recessed within the second substrate such that a connection interface is formed substantially coplanar with the join interface to electrically connect the wiring plane of the second substrate to the first TSVs or the passive device.

16. The interposer of claim 15, wherein the connection interface comprises an Sn:Ag:Cu (SAC) alloy contact.

17. The interposer of claim 15, wherein the connection interface comprises a copper-to-copper direct bond.

18. The interposer of claim 15, wherein:
the first TSVs have a tapered profile which narrows in a direction away from the join interface, and
the second TSVs have a tapered profile which narrows in a direction towards the join interface.

19. The interposer of claim 15, wherein:
the first TSVs have a tapered profile which narrows in a direction away from the join interface, and
the second TSVs have a tapered profile which narrows in a direction away from the join interface.

* * * * *